United States Patent [19]

Pradal

[11] Patent Number: 5,760,663

[45] Date of Patent: Jun. 2, 1998

[54] ELLIPTIC BAW RESONATOR FILTER AND METHOD OF MAKING THE SAME

[75] Inventor: Bortolo M. Pradal, Palatine, Ill.

[73] Assignee: Motorola, Inc., Schaumburg, Ill.

[21] Appl. No.: 701,825

[22] Filed: Aug. 23, 1996

[51] Int. Cl.$^6$ .................... H03H 9/56; H03H 9/60
[52] U.S. Cl. ........................... 333/187; 333/189
[58] Field of Search ........................ 333/187–192

[56] References Cited

U.S. PATENT DOCUMENTS

| | | | |
|---|---|---|---|
| 3,609,601 | 9/1971 | Phillips et al. | 333/192 |
| 4,052,251 | 10/1977 | Weitzel | 156/612 |
| 4,156,214 | 5/1979 | Arvanitis et al. | 333/191 |
| 4,785,269 | 11/1988 | Adam et al. | 333/188 |
| 5,185,589 | 2/1993 | Krishnaswamy et al. | 333/133 |
| 5,194,836 | 3/1993 | Vale et al. | 333/133 |
| 5,231,327 | 7/1993 | Ketcham | 310/366 |
| 5,233,259 | 8/1993 | Krishnaswamy et al. | 310/324 |
| 5,291,159 | 3/1994 | Vale | 333/188 |
| 5,294,898 | 3/1994 | Dworsky et al. | 333/187 |
| 5,373,268 | 12/1994 | Dworsky et al. | 333/187 |
| 5,382,930 | 1/1995 | Stokes et al. | 333/191 |
| 5,404,628 | 4/1995 | Ketcham | 29/25.35 |
| 5,446,306 | 8/1995 | Stokes et al. | 257/416 |

OTHER PUBLICATIONS

IEEE MTT-S Digest 1992, "Modeling of Thin Film Resonators and Filters", K. M. Lakin, pp. 149–152.

IEEE Transactions on Microwave Theory and Techniques, "High-Q Microwave Acoustic Resonators and Filters", Lakin, Kline, and McCarron, vol. 41, No. 12, Dec. 1993, pp. 2139–2146.

IEEE International Frequency Control Symposium 1993, "Overmoded High Q Resonators for Microwave Oscillators", Kline, Lakin and McCarron, pp. 718–721.

*Primary Examiner*—Robert Pascal
*Assistant Examiner*—Barbara Summons
*Attorney, Agent, or Firm*—Kenneth A. Haas

[57] ABSTRACT

An odd order N-pole, (N-1)/2 zero elliptic filter (300) is provided having (N-1)/2 BAW resonators (302 and 304). The first Bulk Acoustic Wave (BAW) resonator (302) operates at a first mode number and a first center frequency and the second BAW resonator (304) operates at a second mode number, and a first center frequency. Operating BAW resonators (302 and 304) at differing modes allows the unwanted passbands (201) of the first BAW resonator (302) to be attenuated by the stopband of the second BAW resonator (304) and vice versa.

12 Claims, 17 Drawing Sheets

5,760,663

ELLIPTIC BAW RESONATOR FILTER AND METHOD OF MAKING THE SAME

FIELD OF THE INVENTION

The present invention relates generally to broadband filters and, in particular, to broadband elliptic filters made from Overmoded Bulk Acoustic Wave piezoelectric resonators.

BACKGROUND OF THE INVENTION

Wideband radio transceivers currently require front-end, broadband filtering. Because of stringent filter specifications of many transceivers (insertion loss, quality factor, size, ..., etc.), expensive frontend filters comprising bulky coaxial resonators in metallic enclosures are typically utilized for broadband filtering. Since next-generation radio transceivers require smaller, less expensive filters, a need exists for a front-end, broadband filter that is less costly and smaller than current filters, yet meets the stringent filter specifications required by many transceivers.

DETAILED DESCRIPTION OF THE DRAWINGS

Stated generally, a broadband elliptic filter is provided having a first Bulk Acoustic Wave (BAW) resonator operating at a first mode number and a first center frequency. A second BAW resonator is provided operating at a second mode number. The first and second BAW resonators operate at the same center frequency. Operating BAW resonators at differing modes allows the unwanted passbands of the first BAW resonator to be attenuated by the second BAW resonator. Such an elliptic filter design allows for an N-pole, (N−1)/2 zero elliptic filter having (N−1)/2 BAW resonators, N capacitors, and N transmission lines.

The present invention encompasses a filter having a first BAW resonator operating at a first mode number and operating at a first center frequency. Additionally, the filter comprises a second BAW resonator operating at a second mode number, and operating at substantially the first center frequency. Such a filter allows for an odd order, N-pole, (N−1)/2 zero filter comprising (N−1)/2 piezoelectric resonators and N transmission lines.

An alternate embodiment of the present invention encompasses a method of making an odd order, N-pole, (N−1)/2 zero elliptic filter by photolithographically creating on a substrate, a first BAW resonator operating at a first mode number and a first center frequency. A second BAW resonator is photolithographically created on the substrate, the second BAW resonator operates at substantially the first center frequency and at a second mode number.

Figure 1:
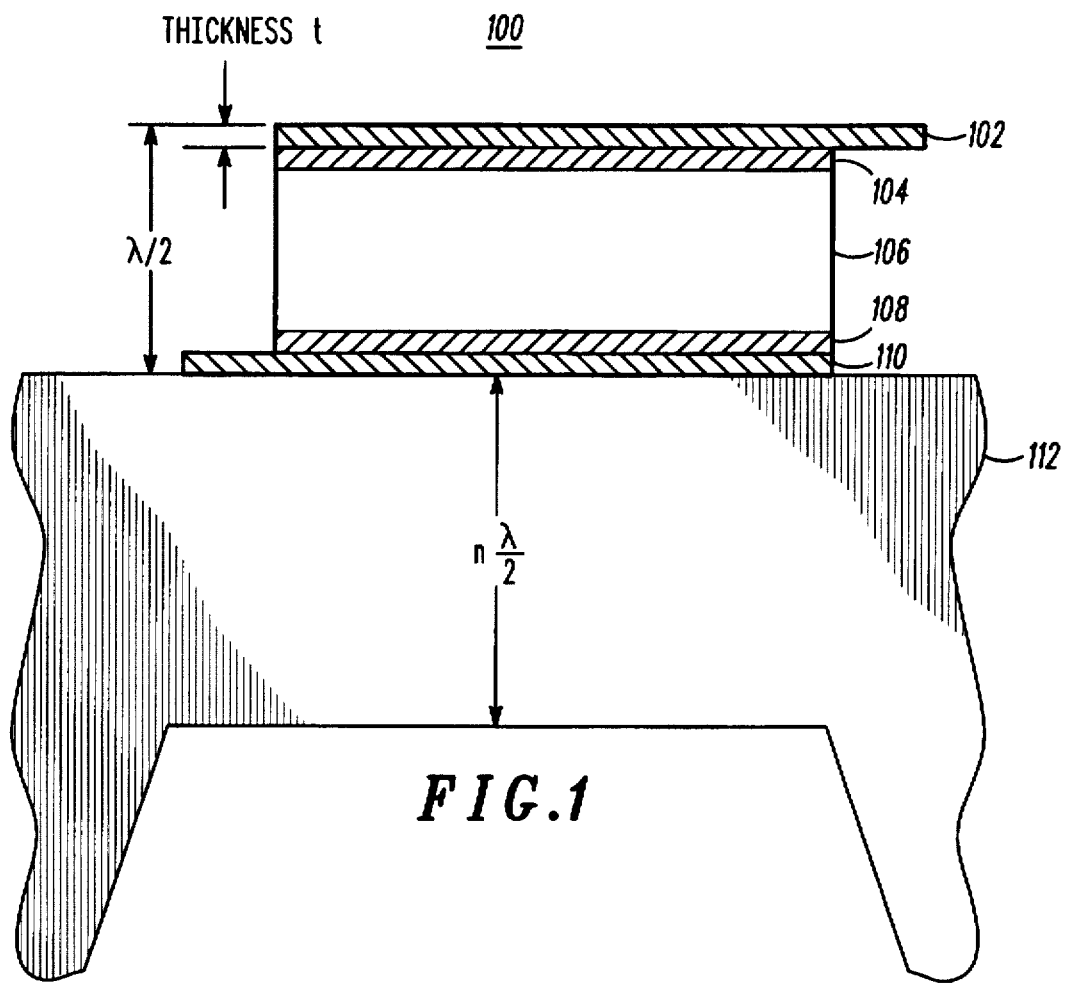
FIG. 1 is an over-moded Bulk Acoustic Wave resonator in accordance with a preferred embodiment of the present invention.

In order to better illustrate a preferred embodiment of the present invention, it will be beneficial to describe operation of an over-moded BAW resonator. FIG. 1 illustrates a BAW resonator 100 in accordance with a preferred embodiment of the present invention. BAW resonator 100 comprises first electrode 102 having a thickness (t), first buffer layer 104, piezoelectric film 106, second buffer layer 108, second electrode 110, and delay section substrate 112. In a preferred embodiment, electrodes 102 and 110 are Aluminum electrodes, but other highly conductive material (for example, Silver or Gold) may be substituted. Buffer layers 104 and 108 serve to protect piezoelectric film 106 during the manufacturing process, and are preferably Silicon Nitride layers. Additionally, substrate 112 is preferably a Fused Quartz substrate, but other substrates (for example, Lithium Niobate, Dilithium Tetraborate, Yttrium Aluminum Garnet, or Sapphire) can be used as well. As indicated in *High-Q Microwave Acoustic Resonators and Filters* by Kenneth Lakin et al., IEEE MTT Trans. Dec. 1993, piezoelectric film 106, made from Aluminum Nitride is utilized as a transducer to excite longitudinal waves in substrate 112. In a preferred embodiment of the present invention piezoelectric film 106 is a Zinc Oxide film utilized because of the larger electromechanical coupling coefficient needed in broad band filters.

BAW resonator 100 is capable of achieving very large quality factor (Q) values provided substrate 11 2 comprises a material with very low acoustic loss and mode numbers of more than one are used. ("Mode number" (n) is defined as the ratio of the acoustic half wavelengths of substrate 112 thickness to the acoustic half wavelength of piezoelectric film 106. For example, as described in Lakin et al., a 1.6 GHz BAW resoanantor 100 with piezoelectric film 106 made of Aluminum Nitride and having 650 micrometer thick Sapphire substrate 112, corresponding to an acoustic half wavelength fundamental resonance of 8.648648 MHz, would be operating at 1600/8.648648=185, or mode 185, and have an unloaded Q of 68,000). Large Q values, however, come at a trade off of decreased filter bandwidth. In a preferred embodiment of the present invention, a compromise between Q and filter bandwidth is made such that BAW resonator 100 operates at a lower mode number (below 20) in order to obtain the necessary bandwidth for front-end, broadband filtering requirements.

Elliptic or Cauer filter bandwidth depends on low pass prototype reflection coefficient (passband ripple), ultimate attenuation required in the stop band, and available resonator shunt to motional capacitance ratio at the working mode. Largest bandwidths are obtained with filters having the lowest stopband attenuation. For a given stopband attenuation the theoretical maximum ripple bandwidth is equal to:

$$\frac{F_o}{\sqrt{\frac{r}{L2*C2}}} \qquad 1)$$

where:

Fo=filter center frequency (Hz), r=resonator (shunt to series) capacitance ratio at the operating mode, and C2*L2 is the smallest product of adjacent, normalized L and C values in standard Cauer low-pass prototype filter tables.

BAW resonator 100 additionally has the property of creating unwanted spurious responses that exist at frequencies on either side of the resonator center frequency. This can be seen in FIG. 2, where a transmission energy versus frequency graph of a mode two BAW resonator 100 is shown. Unwanted spurious responses 201 (referred to as unwanted passbands in a filter context) exist at equal spacing from the center frequency fo on the low and high frequency side of center frequency (pass band) 203 (only low side unwanted passbands 201 are shown). Unwanted passbands 201 exist due to the harmonics of substrate 112's fundamental acoustic resonance. Thus for BAW resonator 100 operating at mode number n, there will be n unwanted passbands 201. The approximate frequency locations of unwanted passbands 201 are given by the formula:

$$F_{spur}(n)=f_o \pm m(f_o/(m+1)) \text{ for } m=1,2,\ldots,n \qquad (2)$$

where $F_{spur}$ (m)=mth spurious pass band frequency $f_o$=filter center frequency n=resonator mode number m=spurious number from center frequency.

Figure 3:
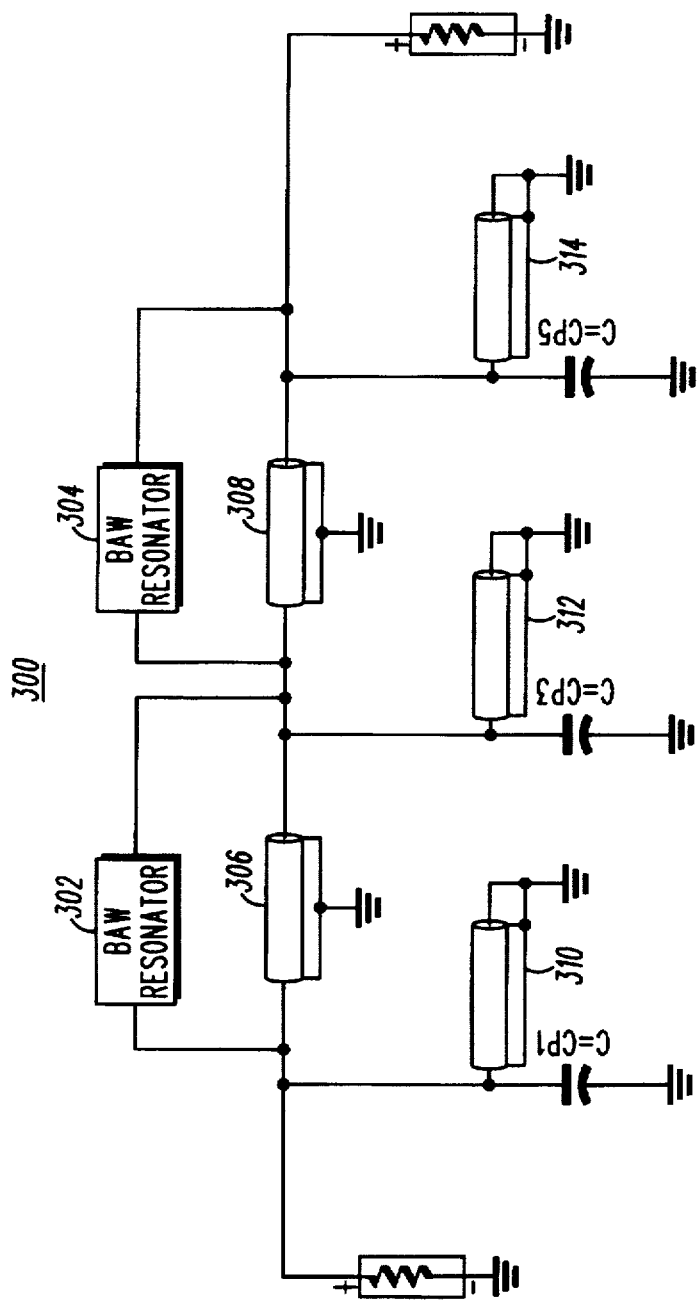
FIG. 3 illustrates a broadband filter in accordance with a preferred embodiment of the present invention.

FIG. 3 illustrates a broadband filter 300 in accordance with a preferred embodiment of the present invention. Filter 300 comprises over-moded BAW resonator 302, overmoded BAW resonator 304 operating at the same center frequency as BAW resonator 302, and coplanar waveguide transmission lines 306–314. In a preferred embodiment of the present invention, filter 300 is an odd order Cauer filter since even ordered filters require the output resonator to be a series LC circuit that cannot be synthesized with the use of BAW resonators like 302 and 304 Although broadband filter 300 is shown as a 5-pole, 2 zero elliptic filter, in alternate embodiments of the present invention, broadband filter 300 can be any odd order N-pole, (N−1)/2 zero elliptic filter with a similar BAW resonator configuration, resulting in an N-pole, (N−1)/2 zero elliptic filter having (N−1)/2 BAW resonators, N capacitors, and N transmission lines. Designing an N-pole, (N−1)/2 zero elliptic filter 300 with (N−1)/2 piezoelectric resonators 302, 304 and N transmission lines 306–314, halves the number of resonators 302, 304 required to achieve a given filter selectivity, has a lower insertion loss, and allows for the manufacture of a front-end, broadband filter that is less costly and smaller than current comb filters in metallic enclosures. Additionally, such a filter continues to meet the stringent filter specifications required by many transceivers.

As discussed above, in a preferred embodiment of the present invention, filter 300 is designed with the aid of transmission lines 306–314 forming shorted or open stubs to replace the design coils. This is done in order to minimize insertion loss when coils of the required inductance have insufficient Q. Additionally, transmission lines 306–314 are inserted in order to increase the bandwidth obtainable with BAW resonators 302 and 304 alone. As discussed below, filter 300 can meet the insertion loss specification of many cellular wideband filters when manufactured with coils having Q as low as 250 to 300 provided that the resonator's Q is above 3,000 (a Q requirement that can be met only by Overmoded BAW resonators working at mode numbers between 2 and 6 when using Fused Quartz substrates).

Simulated Zinc Oxide BAW resonators on Fused Quartz substrates at 836.5 MHz, using the K.L.M. model referenced in the paper "New Equivalent Circuits for Elementary Piezoelectric Transducers" written by R. Krimholtz et al. and published in Electronic Letters Vol. 6 No. 13, 25 June 1970, gave the parameters shown in table I below for a BAW resonator having a shunt capacitance of 1 pF.

TABLE I

Overmoded Resonators- Zinc Oxide on Fused Quartz at 836.5 MHz

| | Mode Cap. ratio | Theoretical max Q | Typical Lm |
|---|---|---|---|
| 0 (ZnO alone) | 12.747 | 1,777 | 458.432 nH |
| 1 | 18.087 | 2,446 | 650.501 nH |
| 2 | 23.428 | 3,075 | 842.582 nH |
| 3 | 28.769 | 3,669 | 1.0346 uH |
| 4 | 34.111 | 4,230 | 1.22677 uH |
| 5 | 39.452 | 4,760 | 1.4189 uH |
| 6 | 44.795 | 5,263 | 1.61101 uH |

In many transceiver applications, filter 300 requires a minimum capacitance ratio of 44 and unloaded Q of at least 3,000 hence, in a preferred embodiment of the present invention mode 2 through 6 resonators are used.

Figure 2:
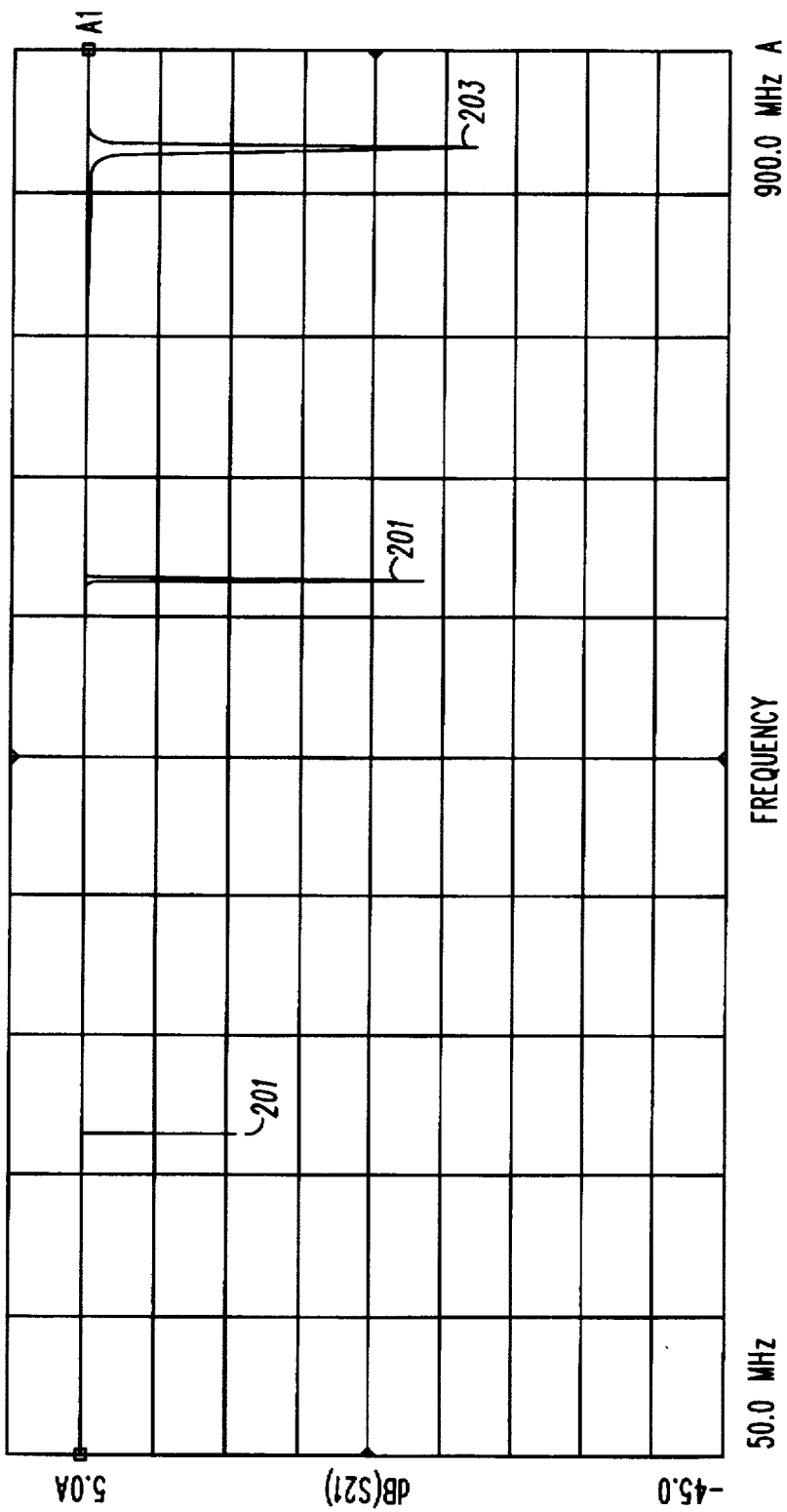
FIG. 2 is a transmission energy versus frequency graph of a Bulk Acoustic Wave resonator operating at mode two.

As illustrated in FIG. 2, when filter 300 is built with resonators 302, 304, each operating at the same mode, secondary passbands 201 appear at the approximate frequencies predicted by equation (2). Because spurious unwanted passbands are typically unacceptable if at levels less than 25 dB below the passband insertion loss, in receiver front end applications it is highly desirable to attenuate all the spurious passbands 201 at least 25 dB. In order to accomplish this, in a preferred embodiment of the present invention BAW resonator 302 operates at a different mode than BAW resonator 304. Designing filter 300 in such a way will result in the stop band of one resonator attenuating the spurious pass bands of the other.

Figure 4:
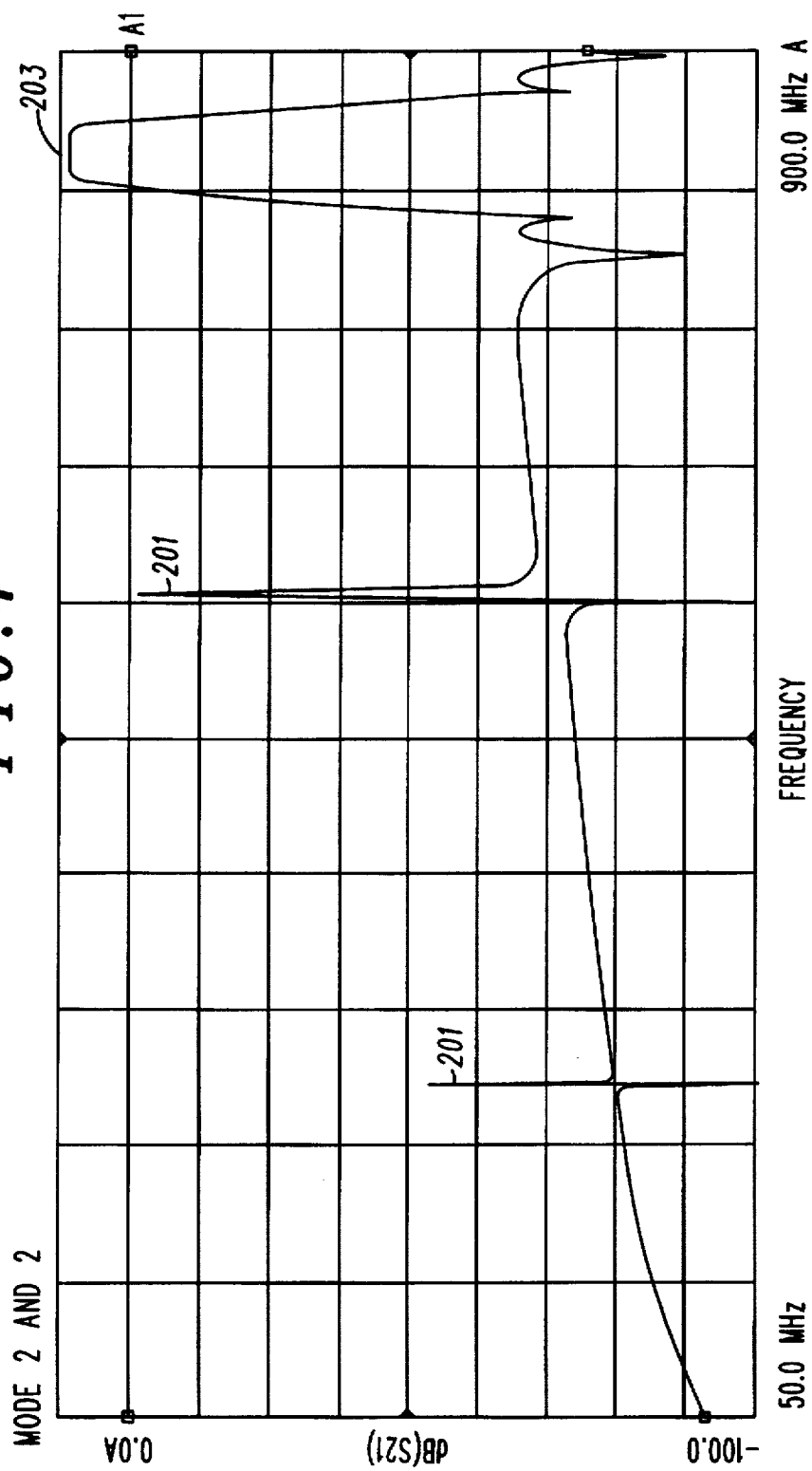
FIGS. 4, 5, and 6 illustrate attenuation of unwanted passbands in accordance with a preferred embodiment of the present invention.
Figure 5:
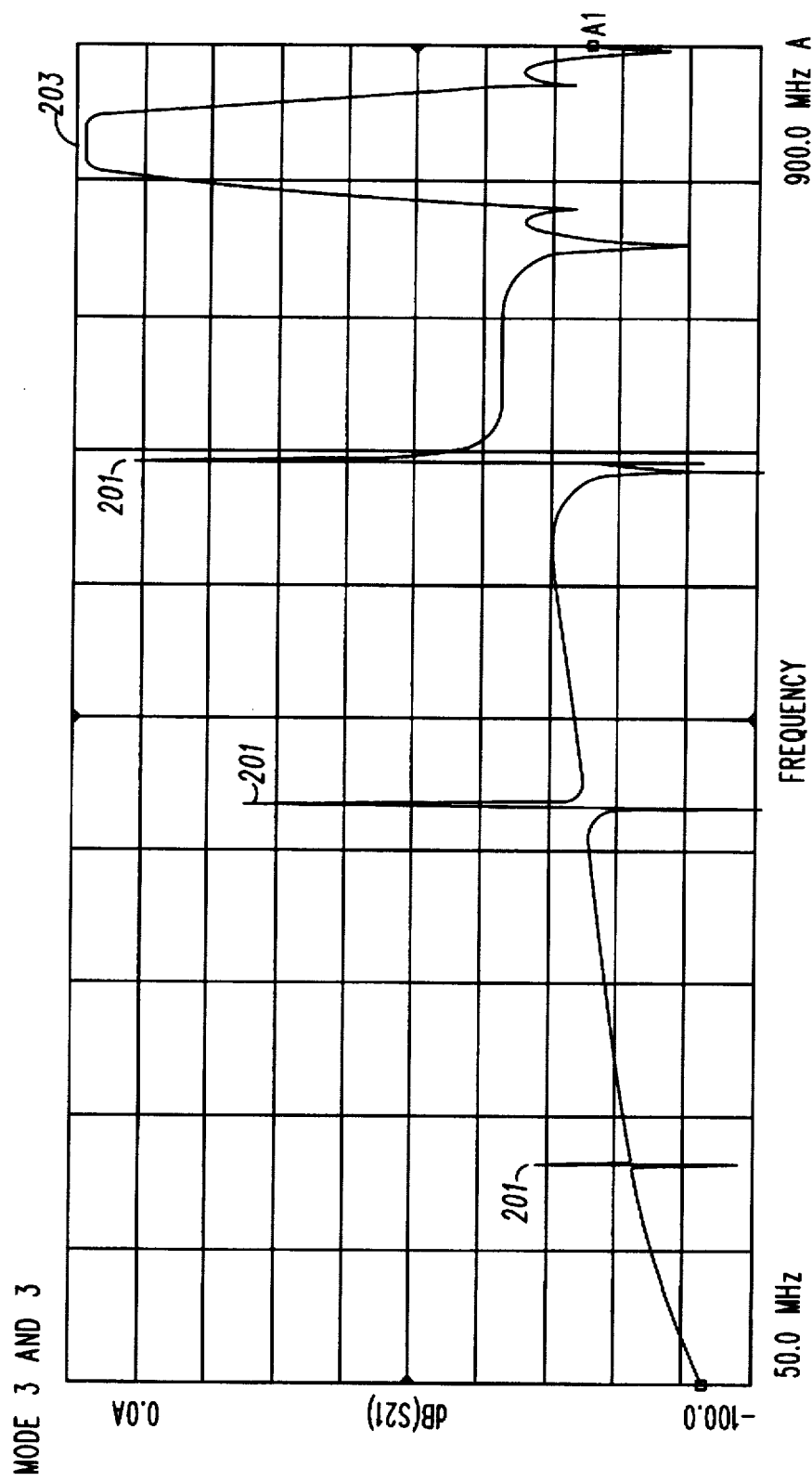
Figure 6:
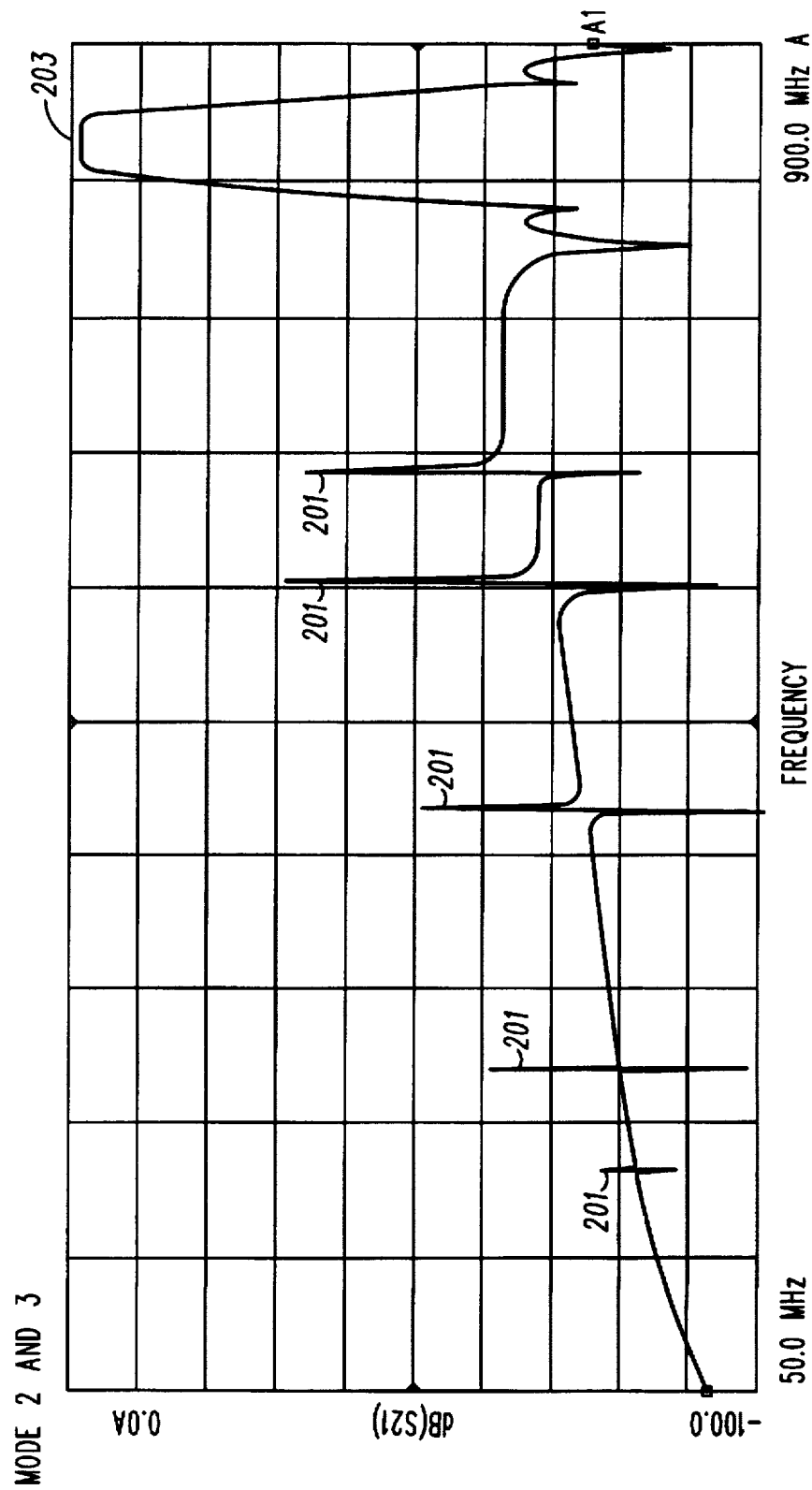

Although BAW resonators 302 and 304 can be designed any number of modes apart (within the limits indicated above), in a preferred embodiment of the present invention, BAW resonator 302 is designed to operate at one or two mode below that of BAW resonator 304. The improvement obtained by designing BAW resonator 302 one mode lower than that of BAW resonator 304 is illustrated in FIGS. 4–6. FIGS. 4 and 5 illustrate unwanted passbands 201 for filter 300 designed with BAW resonator 302 and 304, each operating at mode two and mode three respectively. FIG. 6 illustrates operation of filter 300 with BAW resonator 302 operating at mode two and BAW resonator 304 operating at mode three, with both BAW resonators 302 and 304 operating at the same center frequency. As is evident, designing BAW resonators 302 and 304 with a one mode separation, allows the stop band of one resonator to attenuate the spurious pass bands of the other, resulting in most unwanted passbands 201 being attenuated. In a preferred embodiment of the present invention, the highest two modes are used since the unwanted passbands 201 closest to the passband 203 are higher in level and more difficult to attenuate. In a preferred embodiment of the present invention filter 300 is designed with BAW resonators 302 and 304 operating at modes 2 and 3 or at modes 3 and 4.

In an alternate embodiment of the present invention, unwanted passbands 201 are attenuated by offsetting piezoelectric film 106 thickness between BAW resonator 302 and BAW resonator 304, and compensating the change in center frequency by changing the thickness of electrode 102 accordingly. Such a filter 300 will displace the frequency of unwanted passbands 201 of BAW resonator 302 from those of BAW resonator 304 so that the stop band of one resonator attenuates the spurious passbands of the other.

Figure 7:
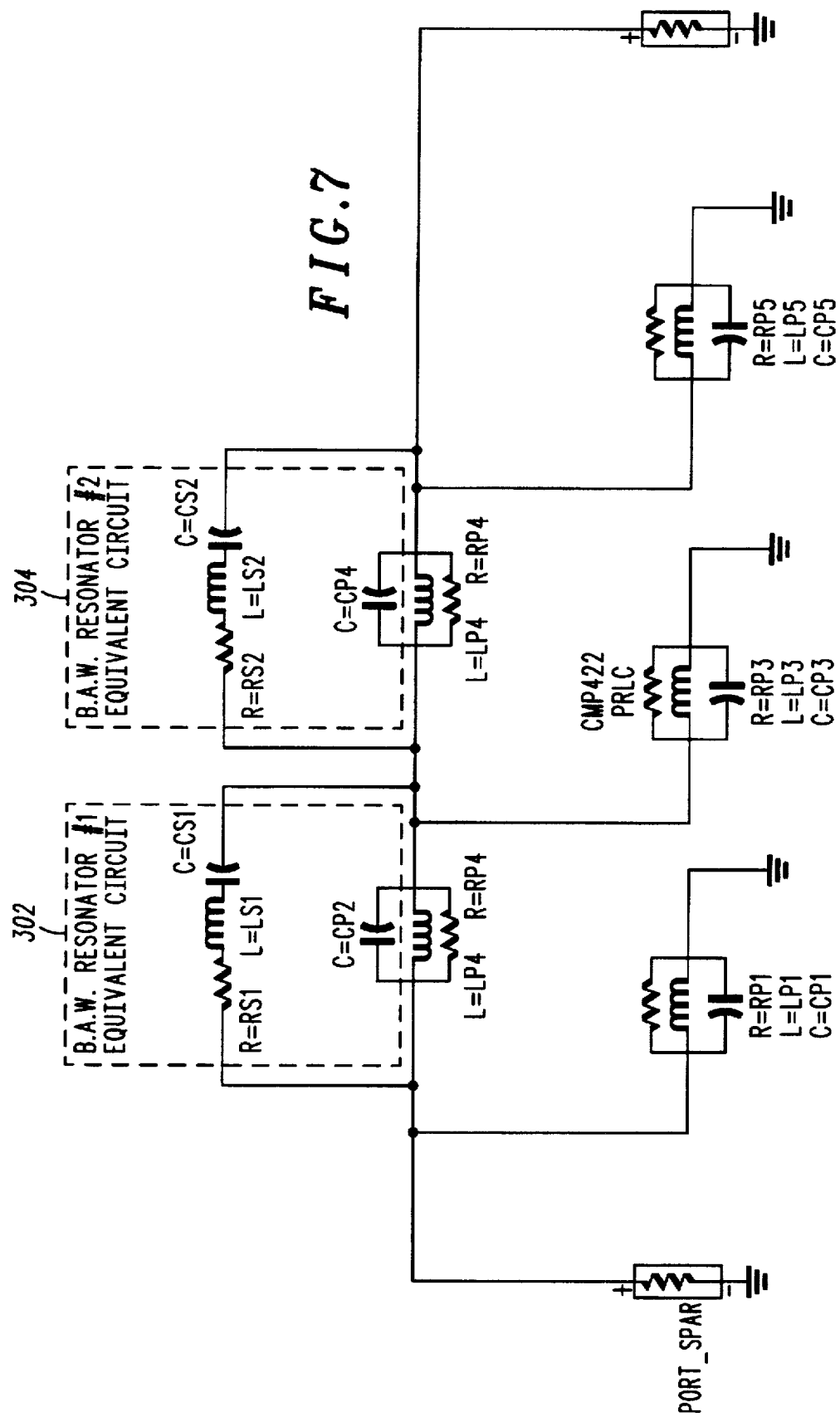
FIG. 7 illustrates a circuit schematic diagram of an elliptic filter in accordance with a preferred embodiment of the present invention.

FIG. 7 illustrates a circuit schematic diagram of elliptic filter 300 in accordance with a preferred embodiment of the present invention. As discussed above, filter 300 is derived from a low pass Cauer C05 10 25 type filter consisting of five parallel LCR and 2 series LCR circuits, all resonant at the same center frequency. In a preferred embodiment of the present invention, the series resonant circuits and two of the shunt capacitors of filter 300 are replaced by the equivalent series LC circuits of BAW resonators 302 and 304, allowing filter 300 to be designed with two piezoelectric resonators. As mentioned above, BAW resonator 302 operates at a different mode than BAW resonator 304, allowing for the stop band of one resonator to attenuate the unwanted passbands of the other. Replacing series resonant circuits and capacitors (CP2 and CP4) of filter 300 with piezoelectric resonators 302, 304 allows for the manufacture of a N-pole, (N−1)/2 zero elliptic front-end, broadband filter 300 comprising only (N−1)/2 piezoelectric resonators. Such a filter 300 is less costly and smaller than current filters, yet meets the stringent filter specifications required by many transceivers.

Figure 8:
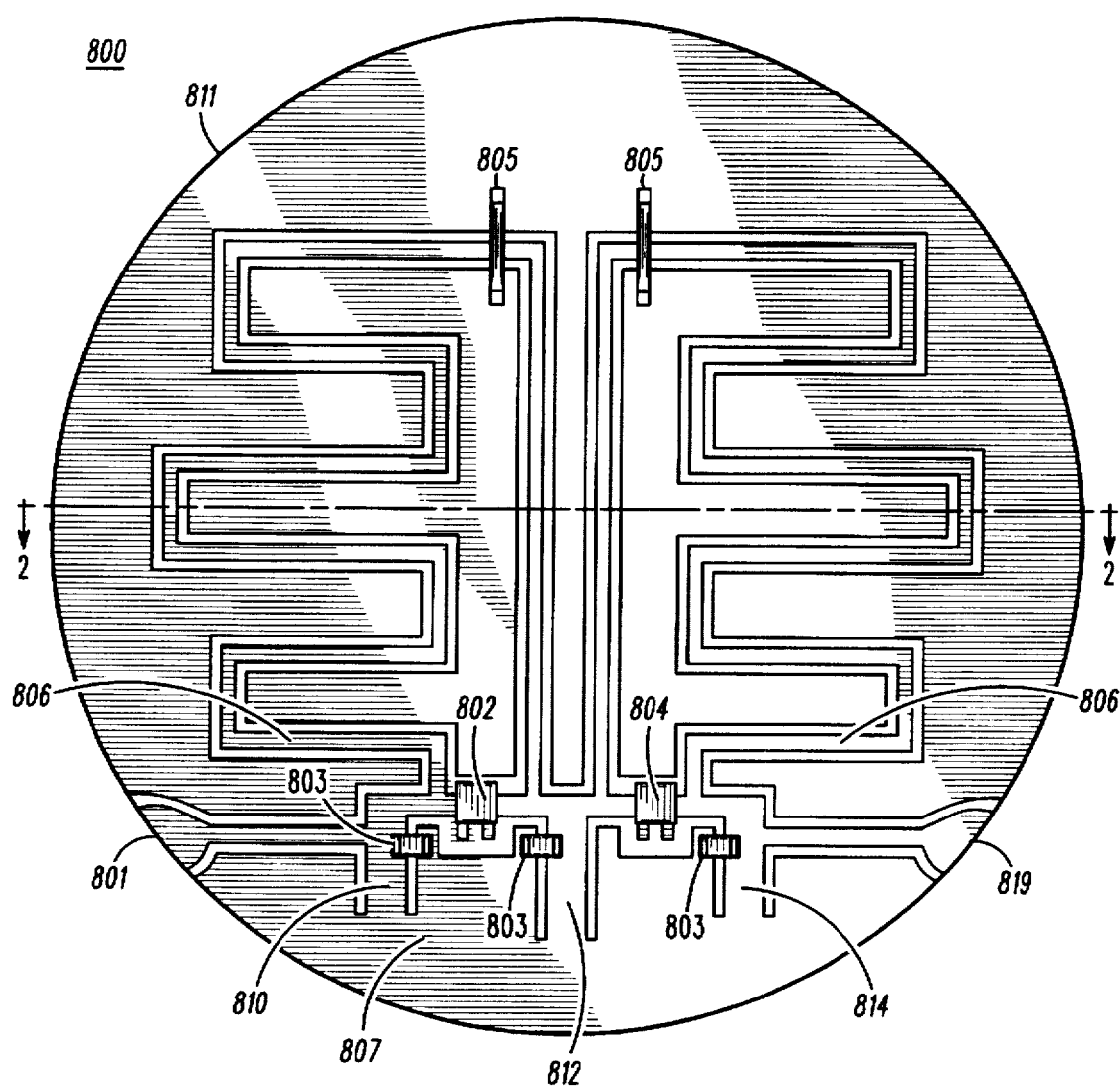
FIG. 8 illustrates a top view of a broadband filter on a substrate in accordance with the preferred embodiment of the present invention.
Figure 9:
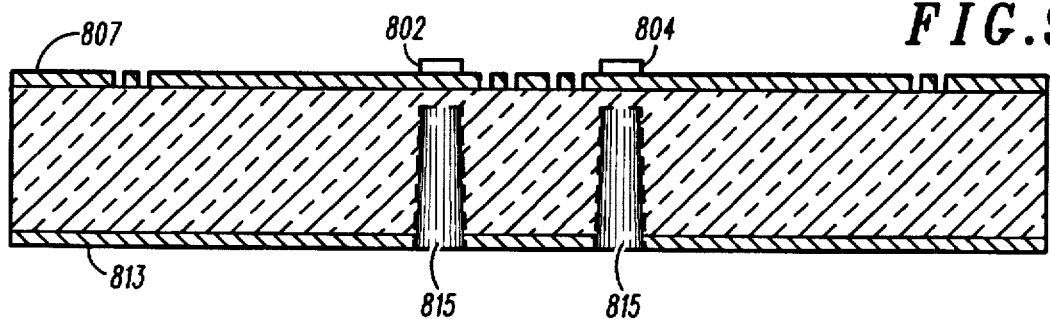
FIG. 9 illustrates a cross-sectional side view of a broadband filter on a substrate in accordance with the preferred embodiment of the present invention.
Figure 10:
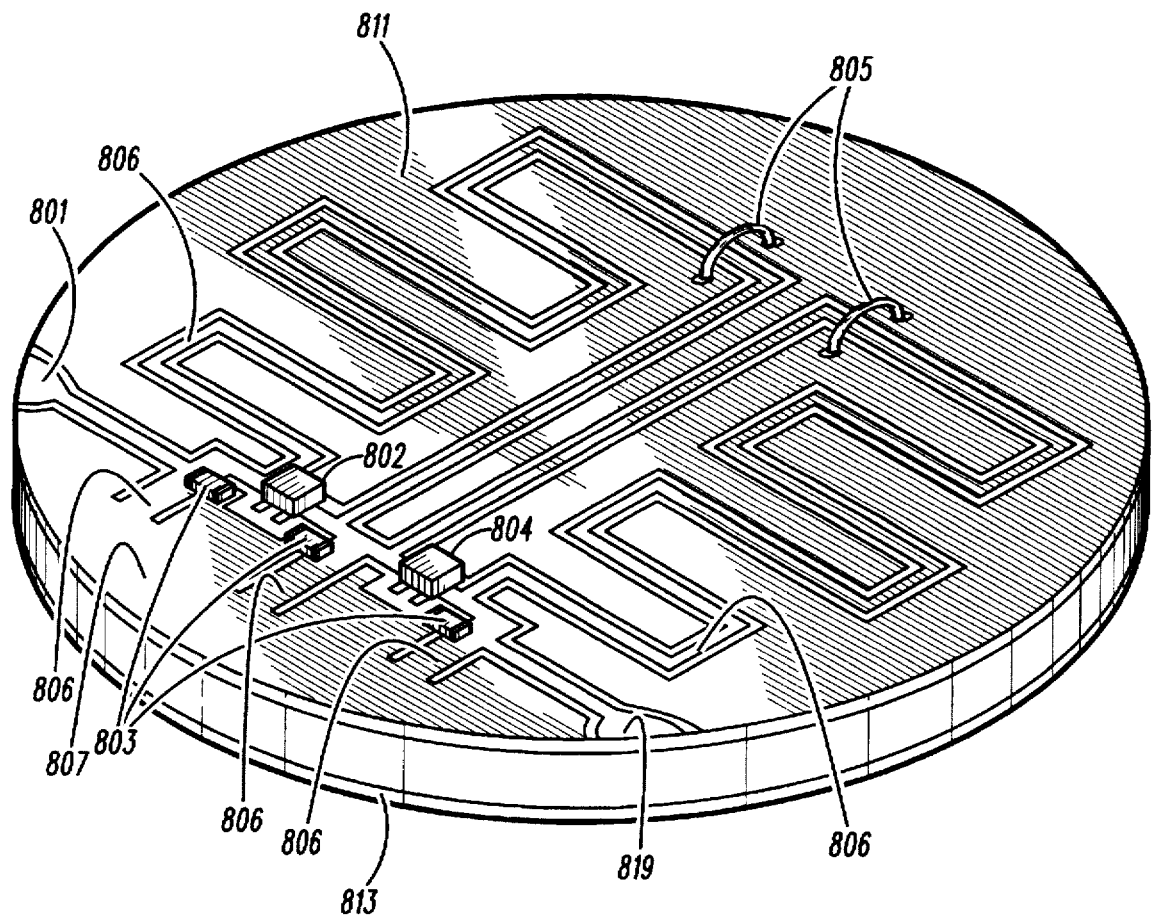
FIG. 10 illustrates a top view of a broadband filter on a substrate in accordance with the preferred embodiment of the present invention.

FIGS. 8 through 10 illustrate broadband filter 800 manufactured on substrate 811 in accordance with a preferred embodiment of the present invention. Filter 800 is a 5 pole, two-zero elliptic filter of the same design as FIG. 3 comprising two overmoded BAW resonators 802 and 804, three short pieces of coplanar waveguide transmission lines 810, 812, and 814, and two coplanar waveguide pieces of transmission lines 806, and three chip capacitors 803. Filter 800 additionally comprises input 801, output 819, air bridges 805, upper ground plane 807, lower ground plane 813, and resonator wells 815. Since coplanar waveguide stubs function as inductances they can be replaced by other types of transmission lines 806, such as, but not limited to ribbon inductances, microstrip, suspended microstrip or stripline, provided they have adequate Q (in a preferred embodiment, about 300). Referring to FIGS. 8 and 10, the length (lss) of the shorted stubs 810, 812, and 814 are calculated with the equation:

$$l_{ss}(n) = \frac{\arctan = [1/(\omega_o Cp(n)Zo)]c}{\omega_o \sqrt{\epsilon_{\textit{eff}}}} \quad n = 1, 2 \text{ and } 3$$

where:

$\omega_o$=Filter radian center frequency (2·π·Fo)

Cp(n )=Stub tuning capacitances Cp1, Cp3, Cp5

Zo=Transmission lines 810, 812, and 814 characteristic impedances $\epsilon_{\textit{eff}}$=Substrate relative effective permittivity of the transmission lines c=velocity of light, 2.997925 E8 m/sec.

The length ($l_{os}$) of open stubs 806 are calculated with the equation:

$$l_{os}(n) = \frac{\arcsin[1/(\omega_o Cp(n)Zo)] \cdot c}{\omega_o \sqrt{\epsilon_{\textit{eff}}}} \quad n = 2 \text{ and } 4$$

where:

$\omega_o$=Filter radian center frequency (2·π·Fo)

Cp(n )=Resonator 802 and 804 shunt capacitances Cp2 and Cp4

Zo=Transmission lines 806 characteristic impedance $\epsilon_{\textit{eff}}$=Substrate relative effective permittivity of the transmission line c=velocity of light, 2.997925 E08 m/sec.

The resonators are designed (when possible) to have their shunt capacitance equal to Cp2 and Cp4. When this is not possible, i.e. when the resonator capacitance ratio is too large, small capacitors of Cp2–Co1 or Cp4–Co2 values (Co1 and Co2 are the resonator shunt capacitance) are added and used to compensate for tolerances shifting the center frequency.

Figure 11:
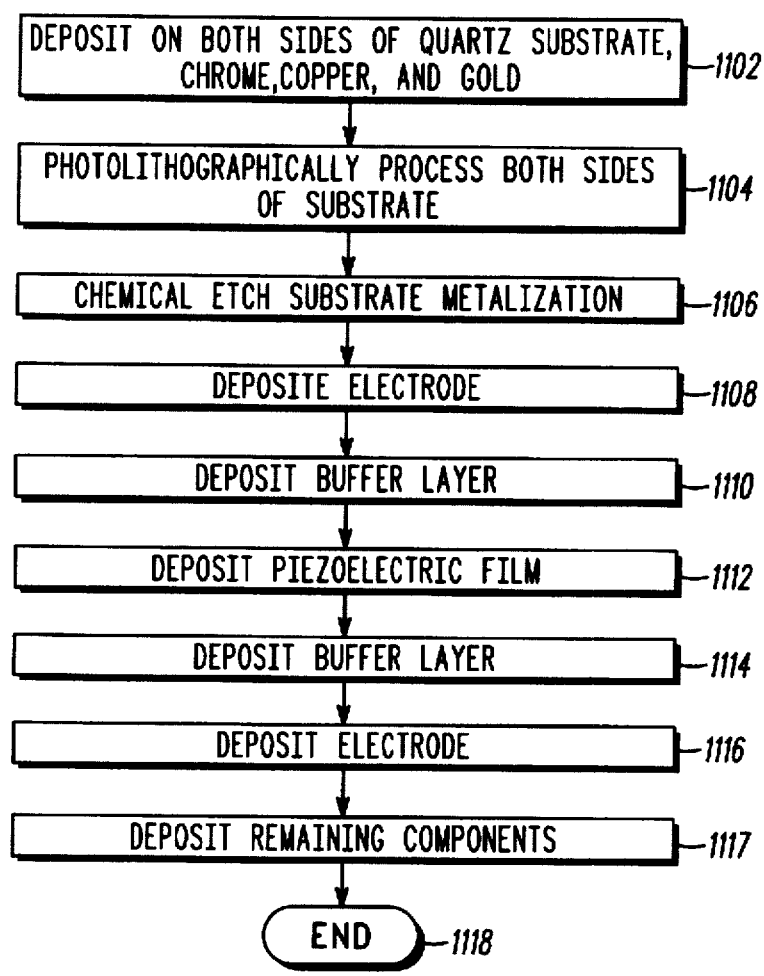
FIG. 11 is a flow chart illustrating manufacture of the filter of FIGS. 8 through 10 in accordance with a preferred embodiment of the present invention.

In a preferred embodiment of the present invention manufacture of filter 800 (FIG. 8) occurs as described in reference to FIG. 11. At step 1102, a 1000 micron thick Fused Quartz substrate 811 with pre-etched resonator wells 815, has deposited on both sides, a 0.1 micron sublayer of chrome, and a 100 micron top layer of copper protected by a 5 micron layer of Gold. Next, at step 1104, both upper and lower sides of substrate 811 are photolithographically processed to expose the desired metalization pattern, and then chemically etched (step 1106) to achieve the desired topography. At step 1108, Aluminum electrode 110 (FIG. 1) (preferably 0.2 microns thick), is deposited on substrate 811 followed by step 1110 where Silicon Nitride buffer layer 108 (preferably 0.15 microns thick) is deposited onto the Aluminum electrode 110. Next, at step 1112, piezoelectric film 106 is deposited on the Silicon Nitride buffer layer. In a preferred embodiment of the present invention (for a 836.5 MHz resonator), piezoelectric film 106 comprises a 3.15177 micron thick layer of Zinc Oxide. At step 1114 a Silicon Nitride buffer layer 104 (preferably 0.15 microns thick) is deposited on piezoelectric film 106, and finally at step 1116, an Aluminum electrode 102 (preferably 0.2 microns thick) is deposited onto buffer layer completing the build of the resonator. During the deposition of the various layers, which are carried out in a sputtering machine using a masking operation, interconnections are achieved by means of the masking operations while individual layer thickness are controlled by optical and electrical means monitoring the final calibration frequency.

The process steps described above are then repeated for the second BAW resonator 804 or alternatively using masks that build the two resonators at the same time (except for the final calibration which accounts for slight differences in thickness between the resonators during the deposition of the various layers). At step 1117, the remaining components, including chip capacitors 803 and air bridges 805 are applied to filter 800 and the process flow ends at step 1118.

EXAMPLES

The following examples serve to give illustrations of the practice of this invention, and are not intended in any way to limit the scope of the invention. All examples are derived from computer simulated circuits made with the use of a MDS (Microwave Design System) Hewlett Packard computer analysis program. The program allows different elliptic band pass filters to be derived from the correspondent low pass prototypes by replacing the low pass normalized L and C's such as those of the tables in the *Handbook for Filter Synthesis*, by Zverev.

Figure 12:
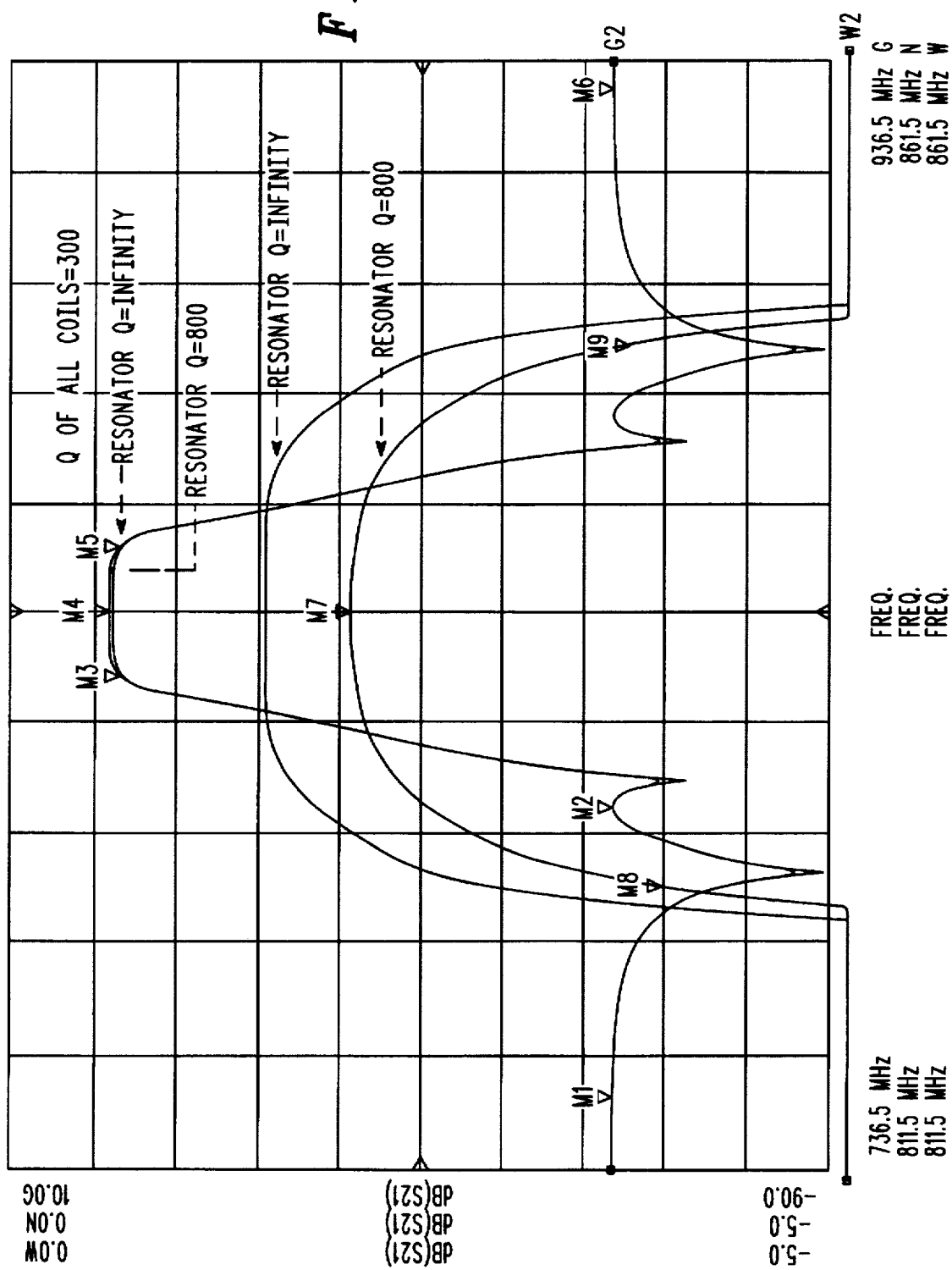
FIG. 12 shows insertion and return loss of a filter manufactured in accordance with a preferred embodiment of the present invention.

The graph of FIG. 12 shows insertion and return loss of filter 300 (FIG. 3) having a 25 MHz bandwidth with a parallel LC circuit Q of 300, and a series LC circuit (circuit's that can be replaced by BAW resonators 302 and 304) having a Q of 800 and infinity. Note that even with the series LC circuits Q of infinity, a flat loss of 1.5 dB occurs at midband and about 3 dB at band edges due to the finite Q of the coils. Additionally, dropping the series LC circuit's Q to 800 added only 0.5 dB at midband and less than 0.97 dB at the band edges.

Figure 13:
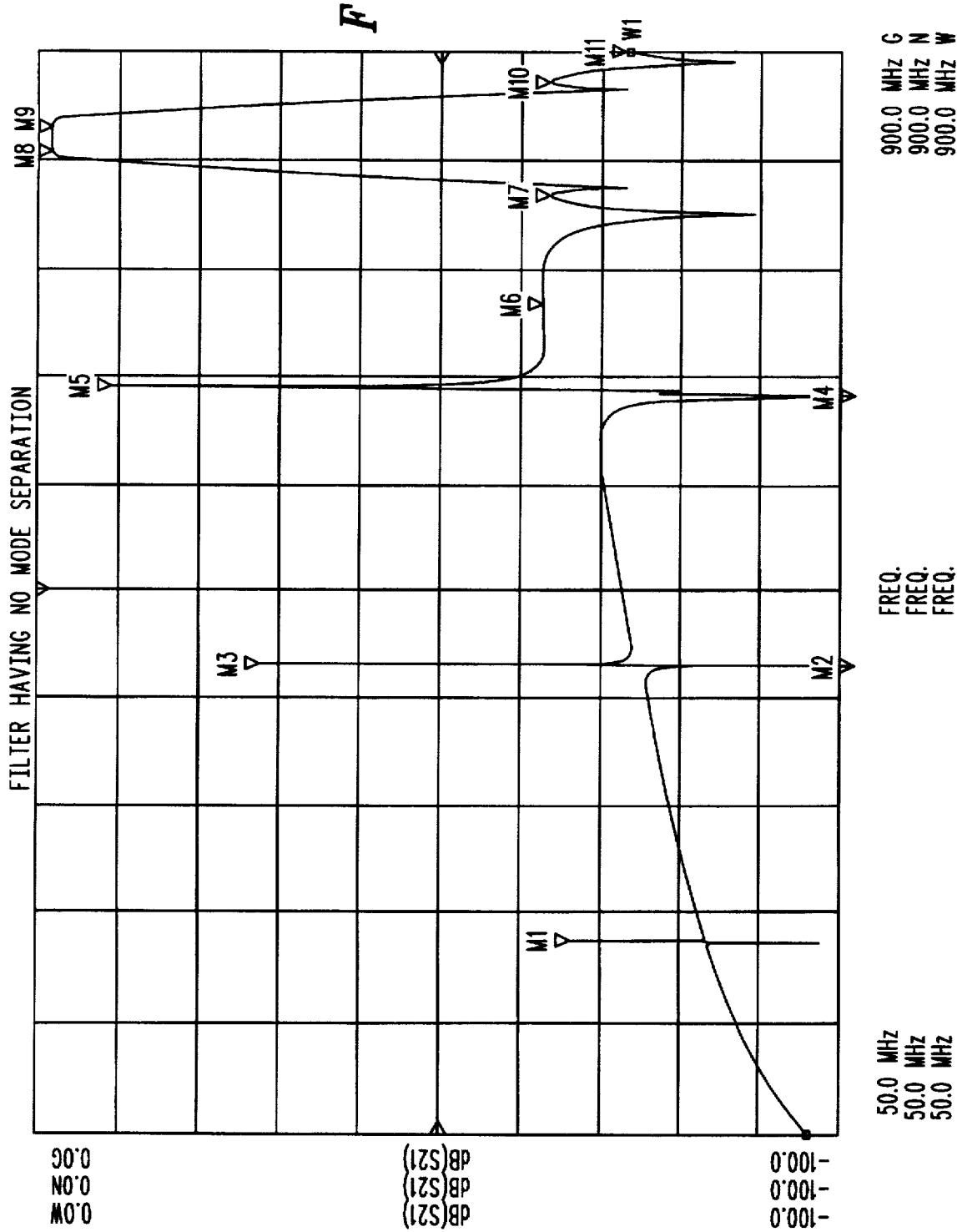
Figure 14:
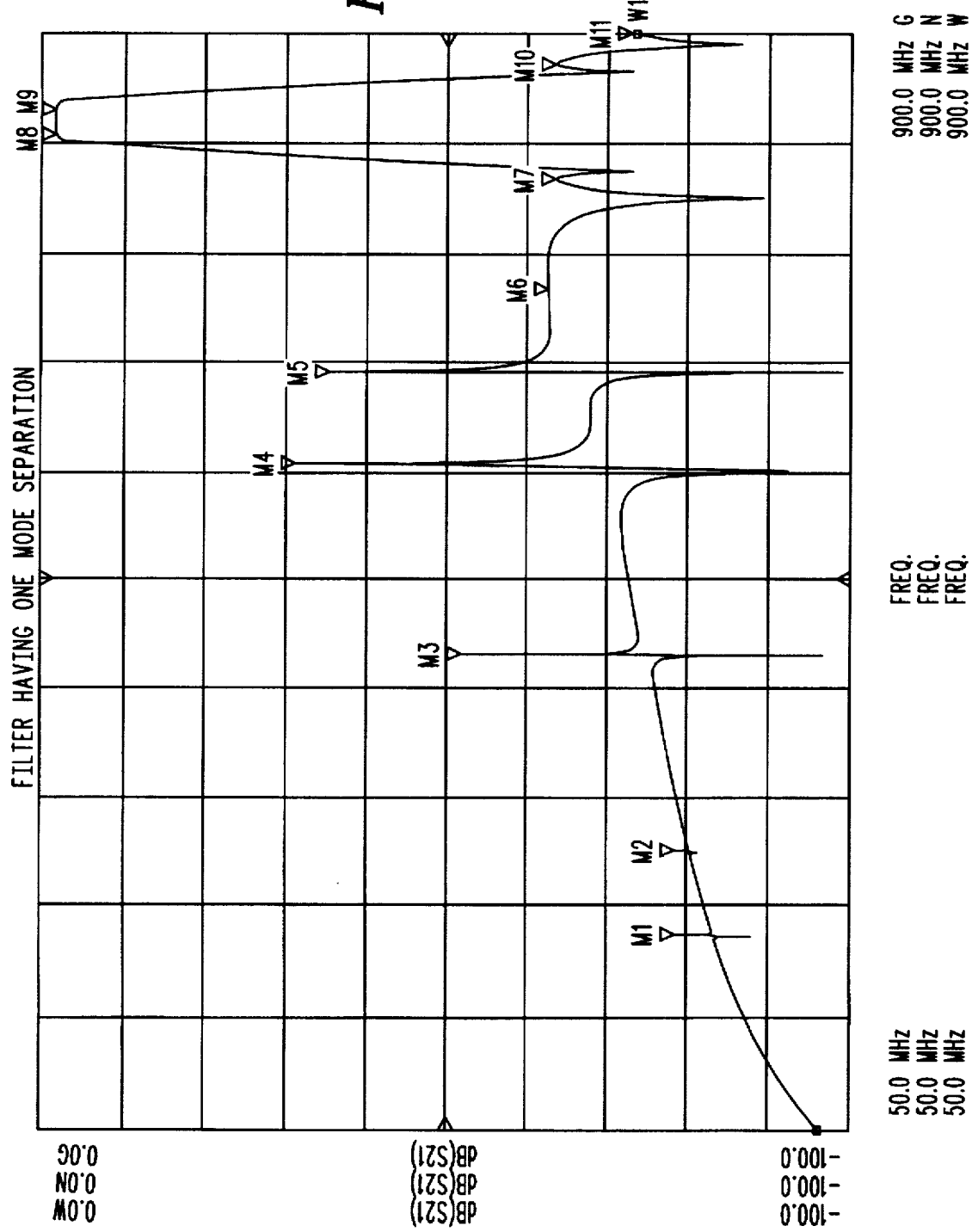
Figure 15:
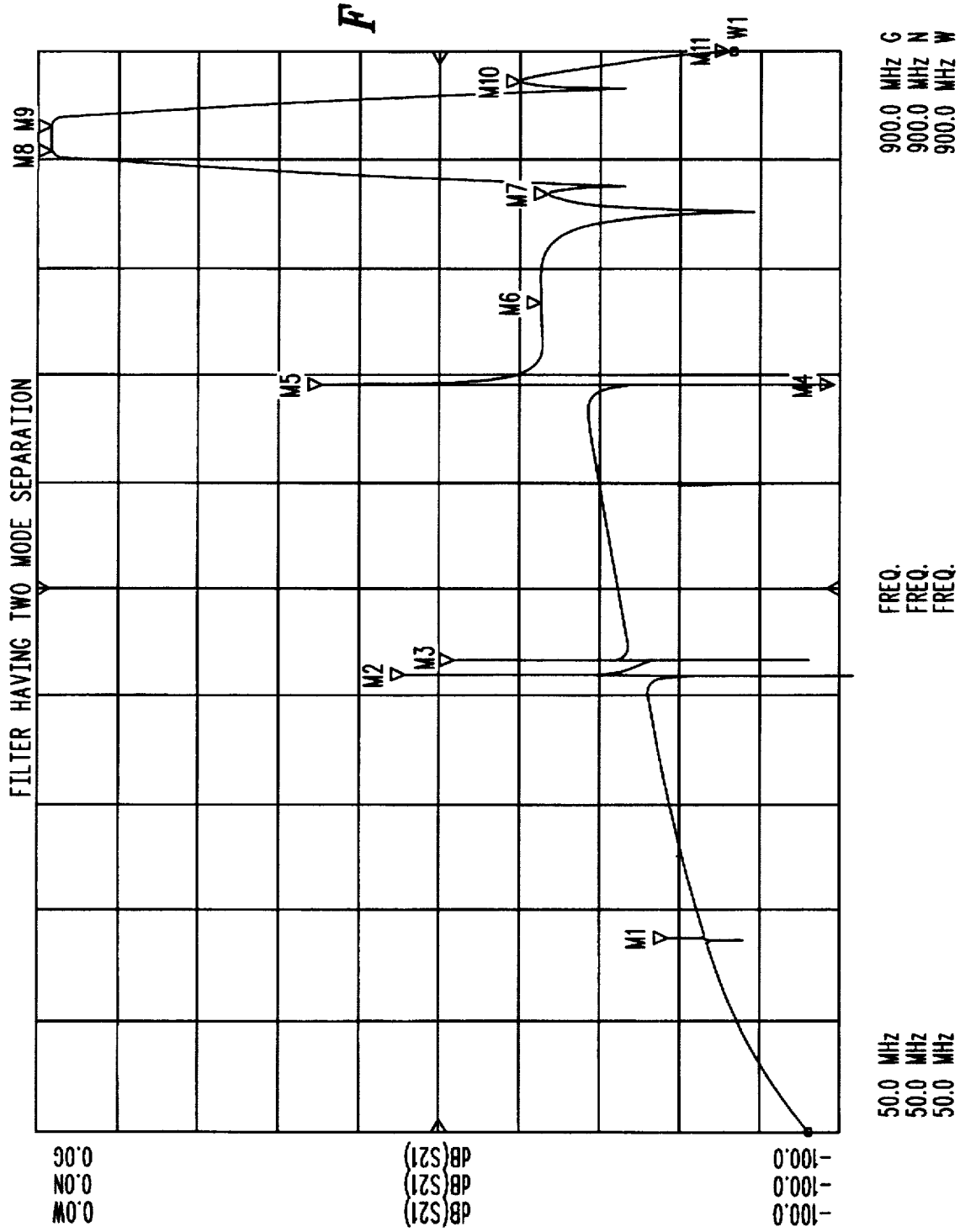
Figure 16:
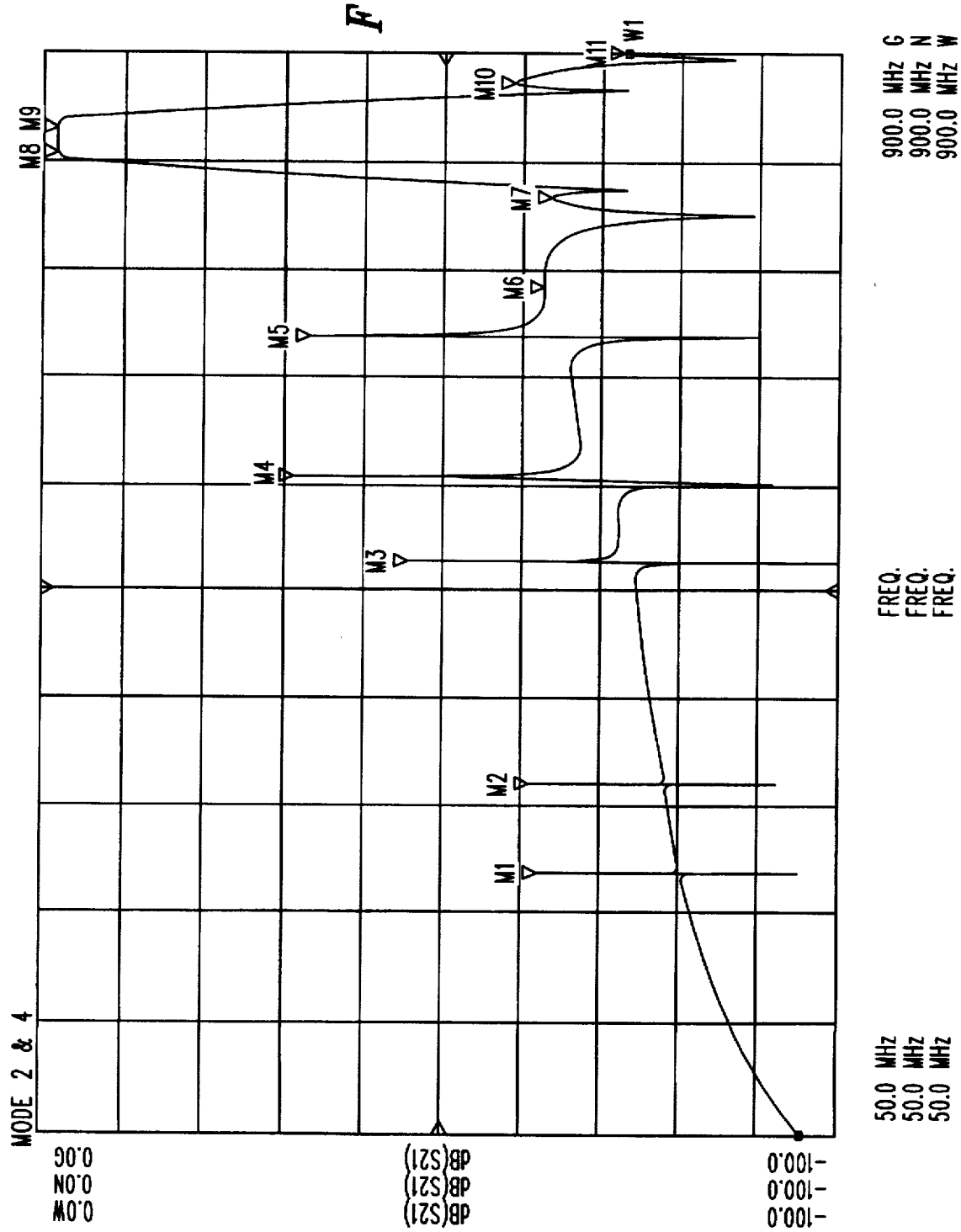
Figure 17:
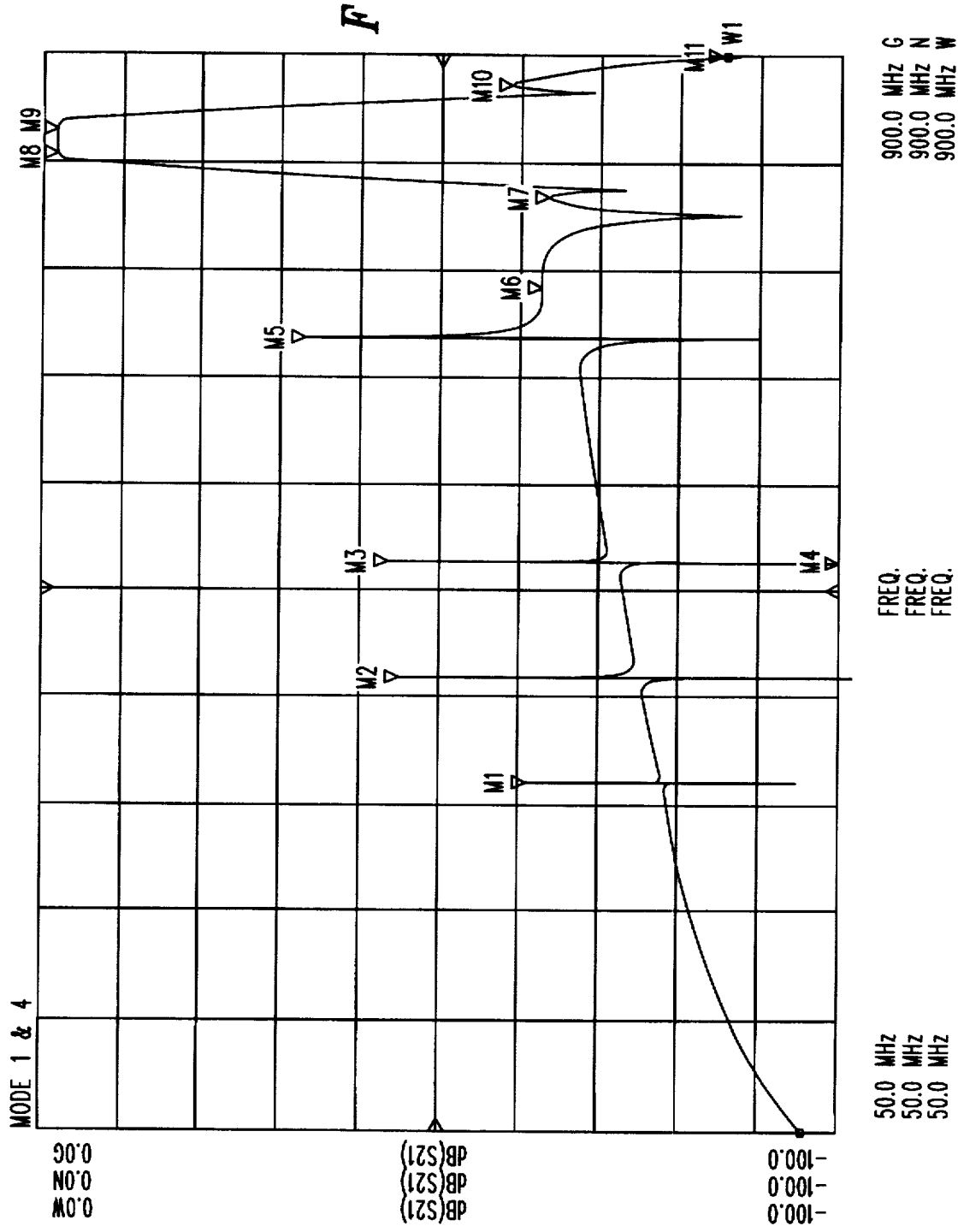

A simulation of filter 300 having BAW resonator 302 with no mode separation (both operating at mode 3), one, and two mode separation from BAW resonator 304 is shown in FIGS. 13–15. As is evident, operation at both a one and two mode separation improve the closer unwanted passbands 201 to at least 32 dB, with operation at two mode separation giving the best overall result. For narrow band filters, where higher mode number resonators can be used, the number of mode separation can be more than two, and depends on the bandwidth and the mode at which the higher mode resonator operates. FIG. 16 illustrates a simulation of filter 300 having resonator 302 operating at mode 2 and resonator 304 at mode 4. When the required Q allows the use of mode 1, similar results can be obtained as shown in FIG. 17, where resonator 302 is operating at mode 1 and resonator 304 at mode 4.

Figure 18:
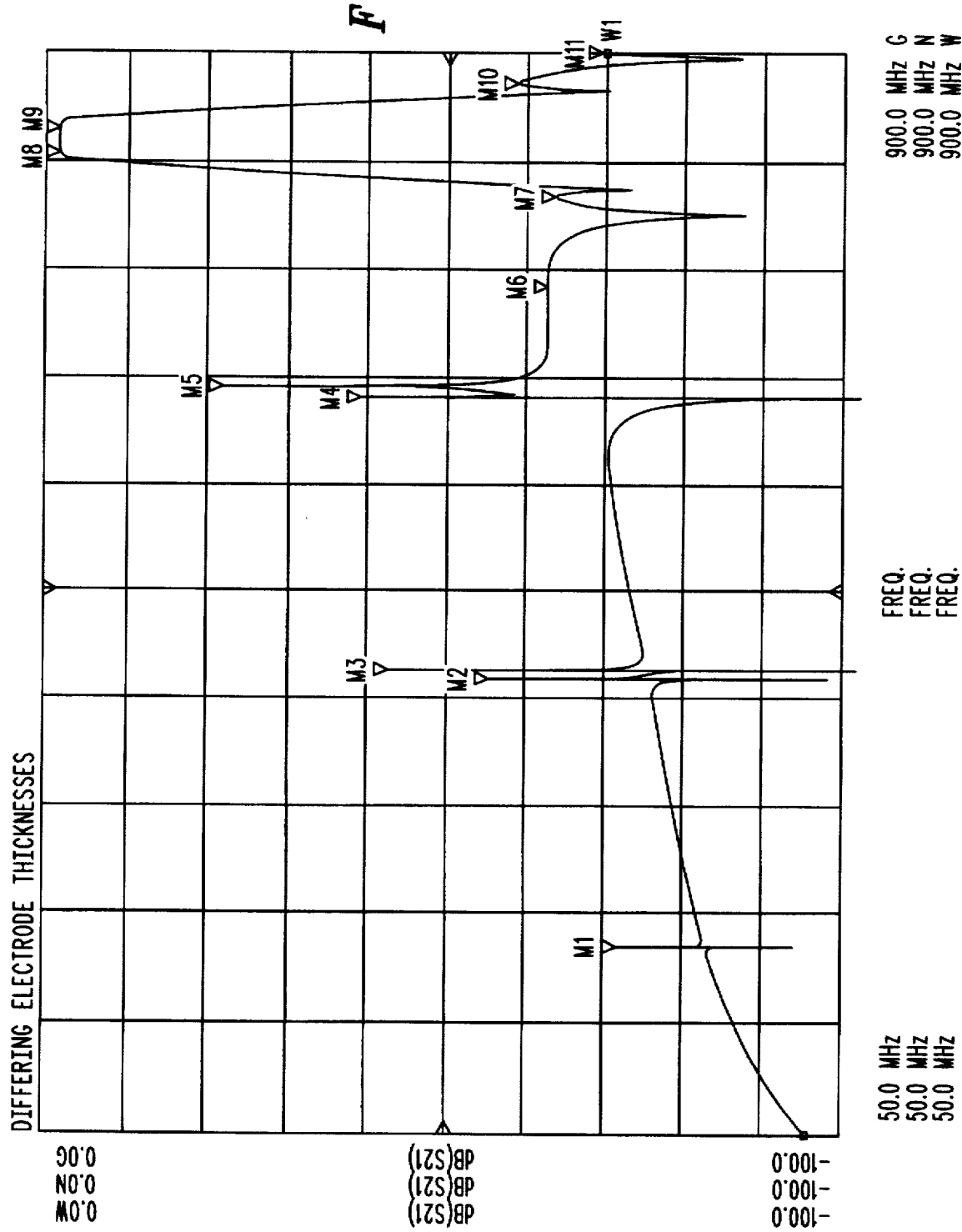

A simulation of filter 300 having a differing electrode thickness between BAW resonators 302 and 304 is illustrated in FIG. 18. In this simulation BAW resonator 302 comprises electrode 102 having a thickness of 0.10 micrometers and piezoelectric thickness of 3.2507 micrometers, with BAW resonator 304 having electrode 102 thickness of 0.29 micrometers and piezoelectric thickness of 3.05935 micrometers. Both BAW resonators 302 and 304 operate at the same center frequency. As is evident, this method is not as effective as is the method of separating modes between BAW resonators 302 and 304, but still reduces the higher frequency unwanted passband 201 to 22 dB and the lower frequency unwanted passbands 201 to 43 and 71 dB respectively.

The descriptions of the invention, the specific details, and the drawings mentioned above, are not meant to limit the scope of the present invention. For example, a combination of designing BAW resonators with differing modes and changing piezoelectric film 106 thickness can be utilized to attenuate unwanted passbands. Additionally, narrowband filters may utilize the present invention by operating BAW resonators at higher modes. It is the intent of the inventor that various modifications can be made to the present invention without varying from the spirit and scope of the invention, and it is intended that all such modifications come within the scope of the following claims.

What is claimed is:

1. A filter comprising:
   a first Bulk Acoustic Wave (BAW) resonator operating at a first mode number, and having a first electrode thickness, said BAW resonator operating at a first center frequency; and
   a second BAW resonator operating at a second mode number differing from the first mode number, and having a second electrode thickness, said BAW resonator operating at substantially the first center frequency.

2. The filter of claim 1 further comprising a capacitor coupled to the first BAW resonator.

3. The filter of claim 1 wherein the first electrode thickness is unequal to the second electrode thickness.

4. The filter of claim 1 further comprising a transmission line coupled to the first BAW resonator.

5. The filter of claim 1 further comprising a design coil coupled to the first BAW resonator.

6. An odd order, N-pole, (N−1)/2 zero filter comprising:
   (N−1)/2 bulk acoustic wave (BAW) resonators, where N>4 and a mode number of at least two resonators differ; and
   N components selected from the group consisting of design coils and transmission lines.

7. The filter of claim 6 wherein an electrode thickness of at least two BAW resonators differ.

8. The filter of claim 6 further comprising N capacitors.

9. A method of making an odd order, N-pole, (N−1)/2 zero elliptic filter, the method comprising the steps of:
   photolithographically creating on a substrate, a first Bulk Acoustic Wave (BAW) resonator operating at a first mode number, said BAW resonator operating at a first center frequency; and
   photolithographically creating on the substrate, a second BAW resonator operating at a second mode number differing from the first mode number, said BAW resonator operating at substantially the first center frequency.

10. The method of claim 9 further comprising the step of attaching a transmission line to the first BAW resonator.

11. The method of claim 9 further comprising the step a attaching a design coil to the first BAW resonator.

12. The method of claim 9 further comprising the step attaching a capacitor to the first BAW resonator.

* * * * *